(12) United States Patent
Xu et al.

(10) Patent No.: US 9,613,941 B2
(45) Date of Patent: Apr. 4, 2017

(54) EXPOSED DIE POWER SEMICONDUCTOR DEVICE

(71) Applicants: Yanbo Xu, Tianjin (CN); Zhijie Wang, Tianjin (CN); Fei Zong, Tianjin (CN)

(72) Inventors: Yanbo Xu, Tianjin (CN); Zhijie Wang, Tianjin (CN); Fei Zong, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 60 days.

(21) Appl. No.: 14/552,442

(22) Filed: Nov. 24, 2014

(65) Prior Publication Data
US 2015/0255443 A1 Sep. 10, 2015

(30) Foreign Application Priority Data
Mar. 6, 2014 (CN) .......................... 2014 1 0167761

(51) Int. Cl.
| | | |
|---|---|---|
| H01L 23/495 | (2006.01) | |
| H01L 25/18 | (2006.01) | |
| H01L 21/56 | (2006.01) | |
| H01L 23/31 | (2006.01) | |
| H01L 23/00 | (2006.01) | |
| H01L 25/00 | (2006.01) | |

(52) U.S. Cl.
CPC .............. *H01L 25/18* (2013.01); *H01L 21/56* (2013.01); *H01L 21/568* (2013.01); *H01L 23/3107* (2013.01); *H01L 23/3121* (2013.01); *H01L 23/4952* (2013.01); *H01L 23/49513* (2013.01); *H01L 23/49524* (2013.01); *H01L 23/49541* (2013.01); *H01L 23/49562* (2013.01); *H01L 23/49572* (2013.01); *H01L 23/49575* (2013.01); *H01L 24/29* (2013.01); *H01L 24/32* (2013.01); *H01L 24/49* (2013.01); *H01L 24/83* (2013.01); *H01L 24/97* (2013.01); *H01L 25/50* (2013.01); *H01L 23/49568* (2013.01); *H01L 24/48* (2013.01); *H01L 24/73* (2013.01); *H01L 24/85* (2013.01); *H01L 24/92* (2013.01); *H01L 2224/29011* (2013.01); *H01L 2224/29013* (2013.01); *H01L 2224/2919* (2013.01); *H01L 2224/32058* (2013.01); *H01L 2224/32105* (2013.01); *H01L 2224/32245* (2013.01);
(Continued)

(58) Field of Classification Search
CPC ....... H01L 2924/00; H01L 2924/00014; H01L 2224/48247; H01L 2224/73265; H01L 2224/48465; H01L 2224/32245; H01L 2924/00012; H01L 2924/181; H01L 2224/49171; H01L 23/49503; H01L 23/49575
See application file for complete search history.

(56) References Cited

U.S. PATENT DOCUMENTS

| | | |
|---|---|---|
| 4,663,833 A | 5/1987 | Tanaka |
| 5,696,666 A | 12/1997 | Gold |

(Continued)

*Primary Examiner* — Bradley K Smith
*Assistant Examiner* — David Goodwin
(74) *Attorney, Agent, or Firm* — Charles E. Bergere

(57) ABSTRACT

A semiconductor package has a lead frame and a power die. The lead frame has a first die paddle with a cavity formed entirely therethrough. The power die, which has a lower surface, is mounted on the first die paddle such that a first portion of the lower surface is attached to the first die paddle using a solderless die-attach adhesive, and a second portion of the lower surface, is not attached to the first die paddle and abuts the cavity formed in the first die paddle such that the second portion is exposed.

6 Claims, 3 Drawing Sheets

(52) U.S. Cl.
CPC ............. *H01L 2224/32257* (2013.01); *H01L 2224/48137* (2013.01); *H01L 2224/48247* (2013.01); *H01L 2224/48465* (2013.01); *H01L 2224/48472* (2013.01); *H01L 2224/4903* (2013.01); *H01L 2224/49171* (2013.01); *H01L 2224/49175* (2013.01); *H01L 2224/73265* (2013.01); *H01L 2224/83005* (2013.01); *H01L 2224/83801* (2013.01); *H01L 2224/83862* (2013.01); *H01L 2224/85005* (2013.01); *H01L 2224/92247* (2013.01); *H01L 2224/97* (2013.01); *H01L 2924/00014* (2013.01); *H01L 2924/15151* (2013.01); *H01L 2924/15157* (2013.01); *H01L 2924/181* (2013.01); *H01L 2924/18165* (2013.01)

(56) References Cited

U.S. PATENT DOCUMENTS

| | | | |
|---|---|---|---|
| 5,905,299 A | 5/1999 | Lacap | |
| 6,202,288 B1 * | 3/2001 | Shiraishi | G11B 5/48 29/603.03 |
| 6,440,779 B1 | 8/2002 | Chiu | |
| 6,809,408 B2 * | 10/2004 | Yu | H01L 21/565 257/666 |
| 7,482,679 B2 | 1/2009 | Aripin | |
| 7,772,036 B2 | 8/2010 | Bauer | |
| 7,977,773 B1 * | 7/2011 | Cusack | H01L 23/49503 257/666 |
| 8,497,164 B2 | 7/2013 | Jereza | |
| 2003/0141575 A1 * | 7/2003 | Yu | H01L 21/565 257/666 |
| 2005/0046008 A1 * | 3/2005 | Gai | H01L 23/3107 257/690 |
| 2007/0111399 A1 | 5/2007 | Goida | |
| 2011/0247210 A1 * | 10/2011 | Val | H01L 21/6835 29/832 |
| 2015/0001618 A1 * | 1/2015 | Hebert | H01L 23/49537 257/337 |

* cited by examiner

EXPOSED DIE POWER SEMICONDUCTOR DEVICE

BACKGROUND

The present invention relates generally to semiconductor packaging using surface-mount technologies (SMTs), and, more particularly, to an exposed pad packaged power semiconductor device.

Packaged power semiconductor devices are commonly used to implement switches and rectifiers in power electronics. In order to assemble a typical power semiconductor package, a power die is mounted on a lead frame die paddle (also known as a flag) using solder paste. The solder paste is then reflowed at a relatively high temperature (e.g., >350° C.) to form a mechanical bond between the power die and the die paddle. Due to the relatively good thermal conductivity properties of the solder, the solder acts as a heat sink that dissipates heat emitted from the power die during operation of the semiconductor device.

After the solder reflow, a control die is mounted to another die paddle of the lead frame using die-attach epoxy that is subsequently cured in an oven at a lower temperature (e.g., 175° C.). The power die and the control die then are electrically connected to one another and to metal leads of the lead frame with bond wires.

Following wire bonding, the assembly (including the power die, control die, metal leads, and bond wires) is mostly encapsulated in molding compound, leaving the distal ends of the leads exposed, and then the molding compound is cured. After encapsulation, the power semiconductor package is singulated (the process of separating adjacent, simultaneously assembled devices) to make a power semiconductor package that is ready for mounting on a circuit board. Singulation also includes cutting and/or removing support structures that were used to hold the metal leads in place.

The need to perform two separate die attach processes, one for the power die with solder and one for the control die with adhesive, adds time and cost to the assembly process. Accordingly, it would be advantageous to be able to assemble a power semiconductor device with just a single die attach step.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION

Figure 1A:
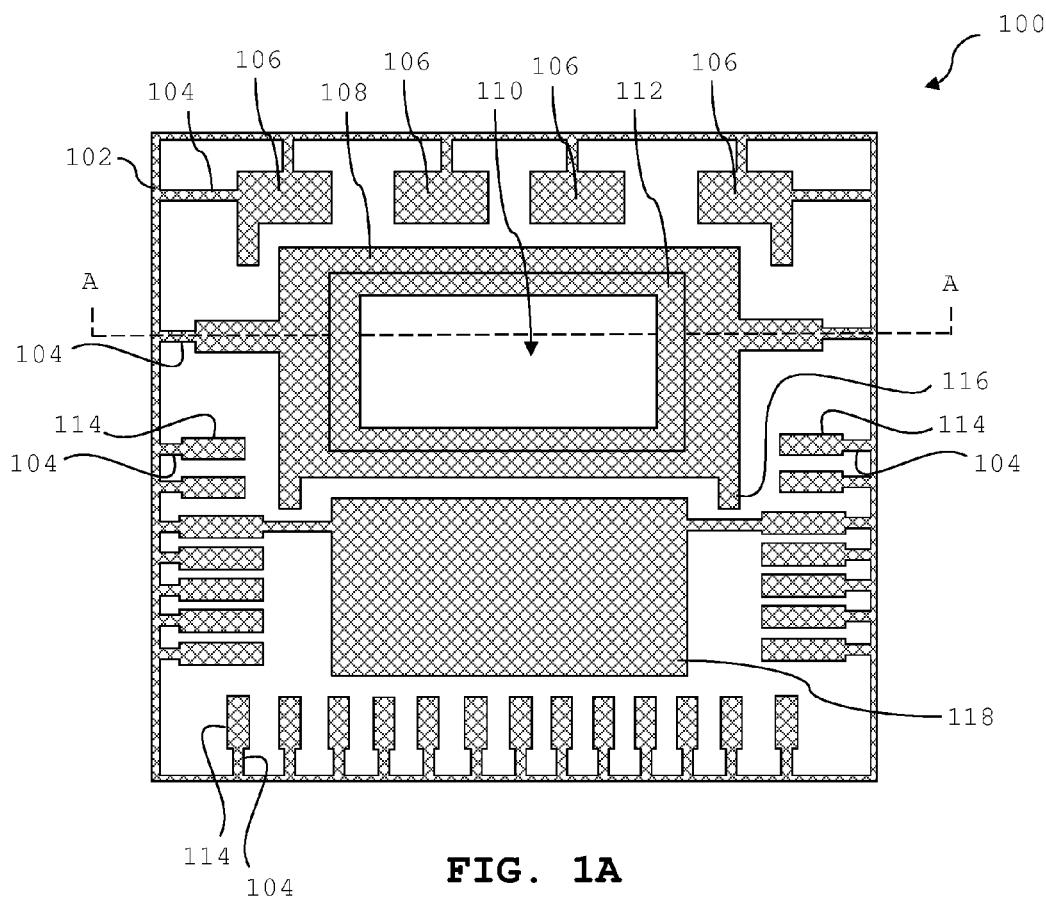
FIG. 1A shows a top view of a quad-flat no-lead (QFN) lead frame according to one embodiment of the present invention.

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the present invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

Mounting a power die on a die paddle using solder paste, as is done during the assembly of conventional power semiconductor packages, has several disadvantages. First, due to the high temperature of the solder reflow, the control die must be mounted and the corresponding epoxy cured after the solder reflow. Thus, the solder reflow creates an additional step.

Second, the high-temperature solder reflow can cause tin in the solder paste to spread, thereby contaminating the environment around the power die paddle, including the control die paddle, metal leads, and other bonding surfaces. This contamination can cause delamination between the molding compound and the lead frame, such that the molding compound separates from the lead frame. In addition, this delamination may also result in bond wires lifting off of their respectively bonding surfaces. The inventors have determined that this bond lifting is particularly an issue for bonding surfaces on the lead frame, such as (i) the power die paddle, (ii) the down bond tab, which is part of the power die paddle, and (iii) the metal leads associated with the control die.

Thus, there is a need to (i) simplify the power semiconductor package assembly process and (ii) eliminate the potential for contamination associated with the high-temperature reflow of solder paste. However, the solution to these issues must also permit sufficient dissipation of the heat emitted from the power die during normal use of the semiconductor package.

In the following description, it will be understood that certain embodiments of the present invention are directed to semiconductor packages comprising dies that are attached to lead frames without using solder paste, and methods of assembling semiconductor packages without using solder paste. In at least some embodiments of the present invention, the particular dies employed require the use of a heat sink to avoid damage to the die when the junction temperature of the die becomes too high. In general, failure to keep the die's junction temperature below the maximum junction temperature can result in damage to the die, or even failure. Dies that require a heat sink include, but are not limited to, what some refer to as "power dies" used in, for example, power semiconductor devices such as those described above. In at least some embodiments of the present invention, the particular dies employed have a driving current greater than about 1 ampere.

In one embodiment of the present invention, a semiconductor package comprises a lead frame and a first die. The lead frame comprises a first die paddle having at least one cavity formed entirely there through. The first die, which comprises a lower surface and requires use of a heat sink to avoid damage to the die during operation, is mounted onto the first die paddle such that (i) a first portion of the lower surface is attached to the first die paddle using a solderless die-attach adhesive, and (ii) a second portion of the lower surface, not attached to the first die paddle, abuts the cavity formed in the first die paddle such that the second portion is exposed to an ambient environment inside the cavity.

Another embodiment of the present invention is a method for assembling the aforementioned semiconductor package.

Figure 1B:
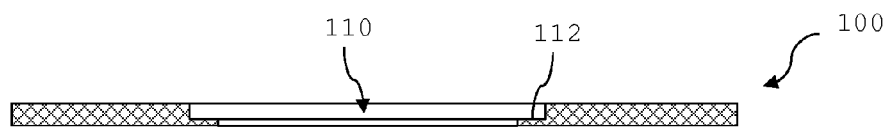
FIG. 1B shows a cross-sectional side view of the QFN lead frame of FIG. 1A along line A-A.

FIGS. 1A and 1B show a top view and a cross-sectional side view A-A, respectively, of a quad-flat no-lead (QFN) lead frame 100 according to one embodiment of the present invention. The QFN lead frame 100 may be used to assemble a power quad-flat no-lead (PQFN) semiconductor package in which a power die is mounted without using solder paste. The QFN lead frame 100 is fabricated from a single sheet of a suitable conducting metal or alloy such as (without limitation) copper. Although not shown, the lead frame 100 may be fabricated on a sheet with other lead frames and detached therefrom using saw singulation, etching, or stamping.

The perimeter of the lead frame 100 is defined by a metal border 102. Within the metal border 102, a pattern of metal is formed by, for example, etching and/or stamping the metal sheet. The metal pattern comprises a power die paddle 108, four power input/output (IO) leads 106, a control die paddle 118, and 27 control IO leads 114. These components are held together and to the metal border 102 using connecting bars 102.

The power die paddle 108 has a rectangular-shaped cavity 110 etched entirely there through, and a ledge 112 along the perimeter of the cavity 110 that is formed by reducing the thickness the paddle adjacent to the cavity 110. Reduction of the thickness may be performed by, for example, etching part of the way through the power die paddle 108 to form the ledge 112. As will be discussed in further detail below, when a power die (not shown) is attached to the power die paddle 108, heat emitted from the power die is able to dissipate to the ambient environment inside the cavity 110.

Figure 2:
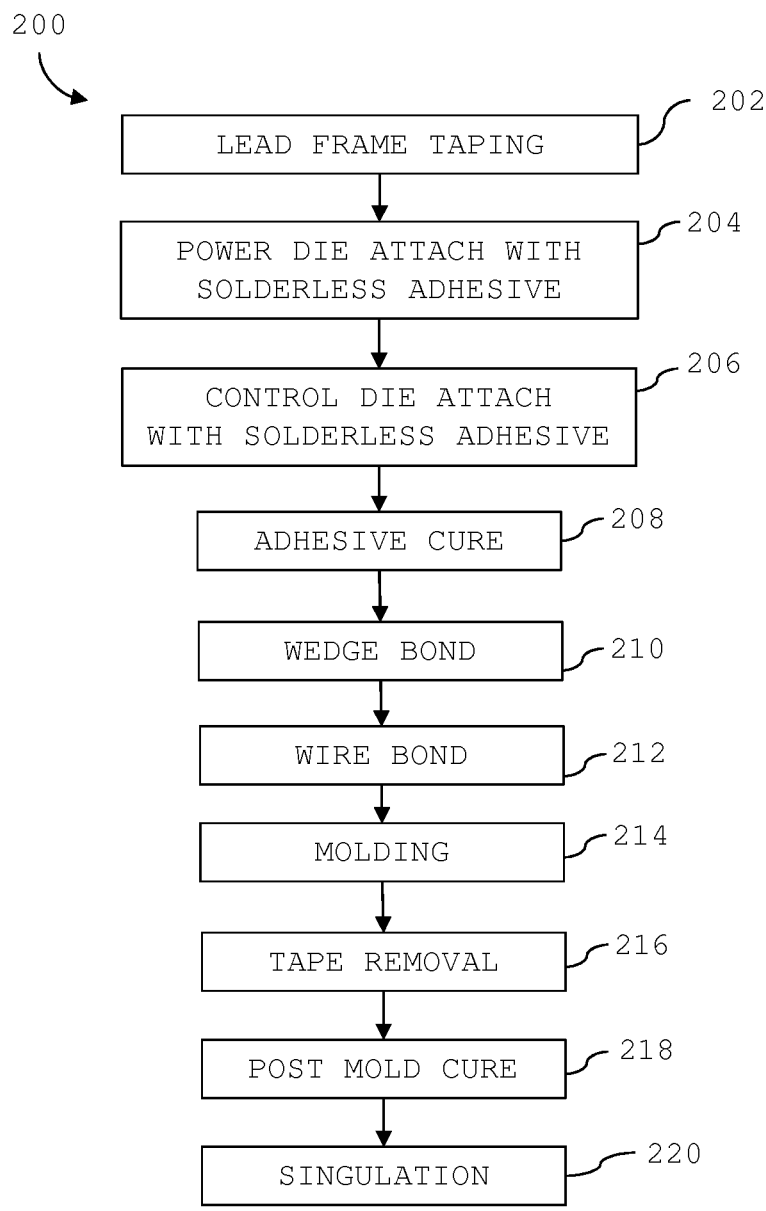
FIG. 2 shows a simplified flow chart of a process for assembling a power semiconductor package according to one embodiment of the present invention.

FIG. 2 shows a simplified flow diagram of a process 200 for assembling a power semiconductor package according to one embodiment of the present invention. Process 200 may be used with the lead frame 100 of FIGS. 1A and 1B or alternative lead frames of the present invention which will become more clear from the following description. For this discussion, process 200 is described relative to its use with the lead frame 100. To further understand process 200, consider FIGS. 3A and 3B.

Figure 3A:
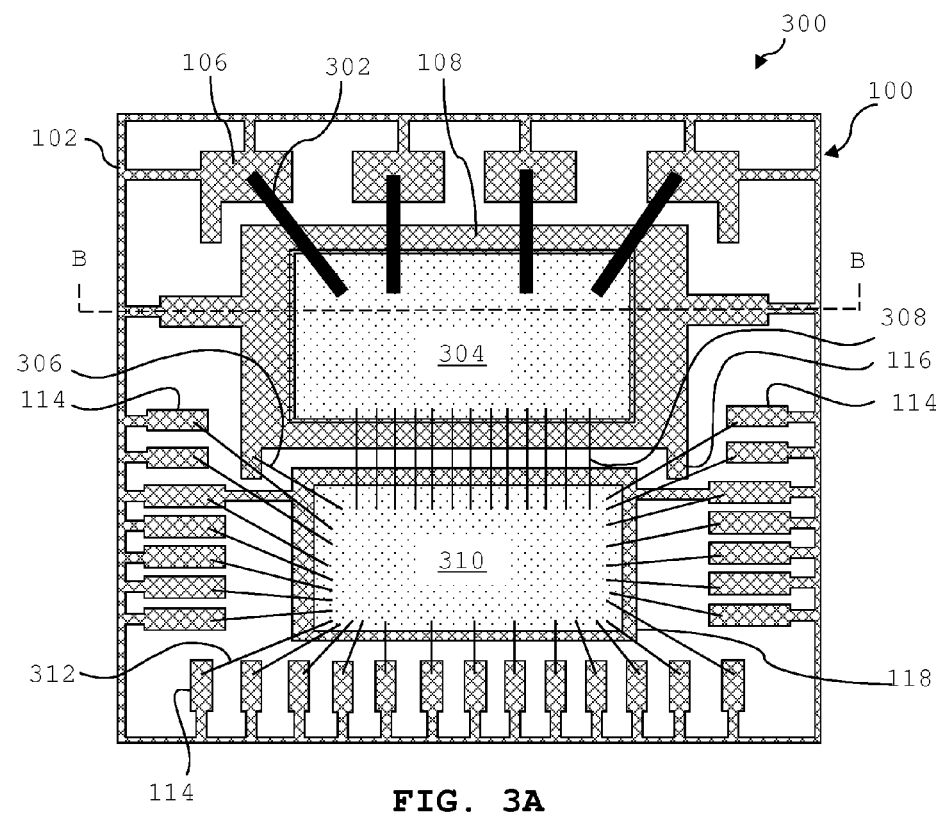
FIG. 3A shows a top view of a power quad-flat no-lead (PQFN) semiconductor package according to one embodiment of the present invention.
Figure 3B:
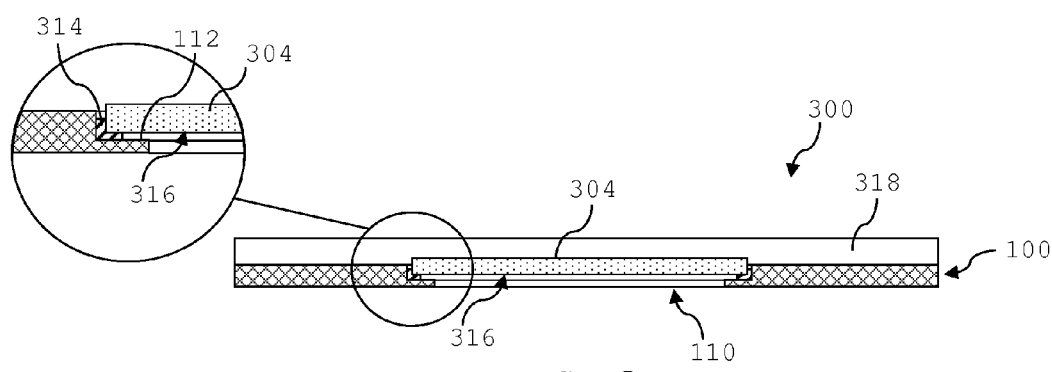
FIG. 3B shows a cross-sectional side view of the PQFN semiconductor package of FIG. 3A along line B-B.

FIGS. 3A and 3B show a top view and a cross-sectional side view B-B, respectively, of a PQFN semiconductor package 300 according to one embodiment of the present invention. In FIG. 3A, the PQFN semiconductor package 300 is shown without molding compound 318 for illustrative purposes.

In step 202, lead frame taping is performed on the lead frame 100. In step 204, a power die 304 is attached to the power die paddle 108 of the lead frame 100. As shown in FIG. 3B, a small portion (i.e., the outer perimeter) of the lower surface 316 of the power die 304 rests on the ledge 112 of the power die paddle 108. The power die 304 is attached to the power die paddle 108 using a solderless die-attach adhesive 314, which is applied around the perimeter of the power die 304. The solderless die-attach adhesive 314 may be, without limitation, a die-attach tape, an epoxy, or other non-epoxy based adhesive.

A larger portion (i.e., the center) of the lower surface 316 of the power die 304 is exposed to the ambient environment inside the cavity 110 of the power die paddle 108. The exposure of the lower surface 316 allows heat emitted from the power die 304 to dissipate into the ambient environment inside the cavity 110. Further, since the solderless die-attach adhesive 314 is not applied to the center of the lower surface 316, the solderless die-attach adhesive 314 does not act as a thermal barrier that prevents heat from dissipating from the center of the lower surface 316.

In step 206, a control die 310 is mounted onto the control die paddle 118 using a solderless die-attach adhesive (not shown). The solderless die-attach adhesive for the power die 304 is then cured in an oven concurrently with the solderless die-attach adhesive for the control die 310 in step 208. Thus, there is no need for separate curing steps for the power die 304 and the control die 310.

In step 210, the power die 304 is wire bonded to the four metal leads 106 via four bond wires 302 using a wedge-bonding technique. In step 212, the control die 310 is wire bonded to (i) 27 metal leads 114 via 27 bond wires 312, (ii) the power die 304 via 13 bond wires 308, and (iii) at least one down bond tab 116 of power die paddle 108 via a bond wire 306 using a ball-bonding technique.

Molding compound 318 is applied in step 214 to encase the top of the lead frame 100, the dies 304 and 310, and the bond wires 302, 306, 308, and 312. Note that the lead frame tape (not shown) applied in step 202 prevents the molding compound from encasing the lower surface 316 of the power die 304. The lead frame tape is removed from the lead frame 100 in step 216, and, in step 218, a post-mold cure is performed. Finally, saw singulation is performed in step 220 to separate the power semiconductor package 300 from other power semiconductor packages (not shown) fabricated on the same array of interconnected lead frames 100.

Because process 200 uses (i) solderless die-attach adhesive 314 to attach the power die 304 and (ii) concurrent curing of the die-attach adhesive for the power die 304 and the control die 310, process 200 can be implemented in fewer steps than comparable prior-art power semiconductor package assembly processes that mount power dies using solder paste and solder reflow.

In addition, since process 200 does not use solder paste and solder reflow to mount the power die 304, contamination issues related to solder paste and solder reflow are eliminated. Elimination of these contamination issues also reduces the chance of delamination between the molding compound and the lead frame.

Figure 4:
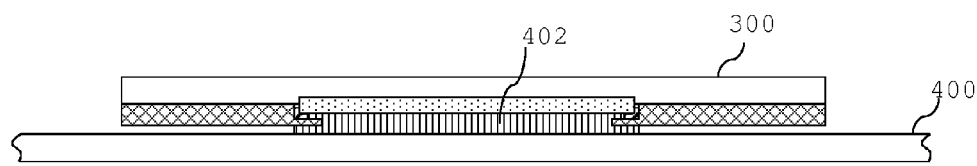
FIG. 4 shows a simplified cross-sectional side view of the power semiconductor package of FIGS. 3A and 3B mounted on a portion of a printed circuit board according to one embodiment of the present invention.

FIG. 4 shows a simplified cross-sectional side view of the power semiconductor package 300 of FIGS. 3A and 3B mounted onto a portion of a printed circuit board (PCB) 400 according to one embodiment of the present invention. As shown, after power semiconductor package 300 is assembled, power semiconductor package 300 may be mounted onto the PCB 400 using solder paste 402, which fills the cavity 110. The solder paste 402 is external to the power semiconductor package 300 and makes contact with the lower surface 316 of the power die 304, thereby acting as a heat sink for the power die 304. Since the solder paste 402 is applied after the molding compound is applied (i.e., step 214), the solder paste 402 does not contaminate the bonding surfaces inside the power semiconductor package 300 such as the down bond tabs 116, the metal leads 106 and 114, or the control die pad 118.

Note that the solder paste 402 may have a lower lead content (e.g., 63%) than the lead content (e.g., 92.5%) of the solder paste used in the prior-art die bonding method described above. In addition, the peak reflow temperature for the solder paste 402 (e.g., 260° C.) may be lower than the peak reflow temperature (350° C.) used to reflow solder in the prior-art die-bonding method described above.

In alternative embodiments, a metal slug (not shown) may be deposited onto the PCB 400 in lieu of the solder paste 402, and the power semiconductor package 300 may be mounted onto the PCB 400 such that the metal slug rests inside the cavity 110.

After the cavity 110 of the power semiconductor package 300 is filled with the solder paste 402 or fitted over the metal slug, the power semiconductor package 300 can exhibit conductive heat-dissipation properties similar to those of prior-art power semiconductor packages in which the power dies are mounted using solder paste.

In general, the particular power semiconductor package configuration shown in FIGS. 3A and 3B, including the configuration of lead frame 100, is merely exemplary to illustrate the attachment of a power die to a power die paddle without using solder paste. Embodiments of the present invention are not limited to the particular package configuration shown in FIGS. 3A and 3B.

Thus, although one embodiment of the present invention was described as being implemented with a QFN lead frame, embodiments of the present invention are not so limited. According to alternative embodiments, the present invention can be implemented using other types of packaging, including, but not limited to, quad-flat packaging (QFP) and small outline integrated circuit (SOIC) packaging.

Further, according to alternative embodiments of the present invention, the power die paddle may have more than one cavity formed therein for heat dissipation. For example, in FIG. 1A, the cavity 110 may be divided into two cavities (i.e., right and left cavities) with a partially-etched bar passing down the center of the cavity 110. In addition, the power die paddle may have one or more cavities that are a different shape than that shown in FIG. 1A. For example, the cavities may be square, circular, or any other suitable shape.

Yet further, although FIGS. 3A and 3B show an embodiment in which the power die paddle 108 has a ledge 112 and the power die 304 rests on the ledge 112, embodiments of the present invention are not so limited. According to alternative embodiments, the partial etching used to form the ledge 112 may be eliminated, and the power die 304 may rest on the portion of the upper surface of the power die paddle 108 that otherwise would have been removed by the partial etching used to form the ledge 112.

It will be further understood that various changes in the details, materials, and arrangements of the parts which have been described and illustrated in order to explain the nature of this invention may be made by those skilled in the art without departing from the scope of the invention as expressed in the following claims. For example, different wire bonding techniques may be used than those discussed above (e.g., bond wires 302 could be formed using a ball bonding technique rather than a wedge bonding technique). As another example, the metal pattern formed on the lead frame may be different than that shown in FIG. 1A (e.g., the lead frame may have a different number of metal leads).

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Terms of orientation such as "lower," "upper," "horizontal," "vertical," "above," "below," "up," "down," "top," "bottom," "right," and "left" well as derivatives thereof (e.g., "horizontally," "vertically," etc.) should be construed to refer to the orientation as shown in the drawing under discussion. These terms of orientation are for convenience of description and do not require that the apparatus be constructed or operated in a particular orientation.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. A semiconductor package, comprising:
a lead frame comprising a first die paddle having at least one cavity formed entirely therethrough, and a ledge formed at at least two opposite sides of the at least one cavity, wherein a thickness of the ledge is less than a thickness of the first die paddle;
a first die comprising a lower surface, wherein:
   a first portion of the lower surface is attached to the ledge using a die-attach material; and
   a second portion of the lower surface that is not attached to the ledge, is exposed to an ambient environment through the at least one cavity, wherein the first die is at least partially embedded in the at least one cavity;
a plurality of bond wires electrically connecting the first die to the lead frame; and
a molding compound encapsulating an upper surface of the lead frame, the bond wires, and an upper portion of the first die,
wherein the semiconductor package is mounted on a printed circuit board after application of the molding compound using solder paste, wherein the solder paste fills at least a portion of the at least one cavity and contacts the second portion of the lower surface of the first die.

2. The semiconductor package of claim 1, wherein:
the die-attach material is a solderless die-attach adhesive.

3. The semiconductor package of claim 2, wherein the solderless die-attach adhesive is an epoxy or die-attach tape.

4. The semiconductor package of claim 1, wherein:
the lead frame further comprises a second die paddle; and
the semiconductor package further comprises a second die mounted on the second die paddle using the die-attach material, wherein the die-attach material of the first die and the second die is cured concurrently.

5. The semiconductor package of claim 1, wherein the first die has a driving current greater than about 1 ampere.

6. The semiconductor package of claim 1, further comprising a heat sink attached to the second portion of the lower surface of the first die, wherein an outer surface of the heat sink is exposed.

* * * * *